United States Patent
Salome et al.

(10) Patent No.: US 6,573,778 B2
(45) Date of Patent: Jun. 3, 2003

(54) ELECTROSTATIC DISCHARGE PROTECTION DEVICE FOR AN INTEGRATED TRANSISTOR

(75) Inventors: Pascal Salome, Grenoble (FR); Guy Mabboux, Chapareillan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/934,452

(22) Filed: Aug. 21, 2001

(65) Prior Publication Data
US 2002/0053934 A1 May 9, 2002

(30) Foreign Application Priority Data

Aug. 22, 2000 (FR) .............................................. 00 10814

(51) Int. Cl.[7] .............................................. H03K 5/08
(52) U.S. Cl. ...................................................... 327/310
(58) Field of Search ........................... 327/309, 310, 327/312, 313, 314, 318, 319, 320, 321, 323, 327, 328, 333

(56) References Cited

U.S. PATENT DOCUMENTS

| | | | | |
|---|---|---|---|---|
| 4,703,201 A | * | 10/1987 | McGrail | 327/206 |
| 4,855,620 A | | 8/1989 | Duvvury et al. | 307/448 |
| 5,180,938 A | | 1/1993 | Sin | 307/605 |
| 5,208,719 A | * | 5/1993 | Wei | 257/355 |
| 5,345,357 A | * | 9/1994 | Pianka | 361/111 |
| 5,400,202 A | | 3/1995 | Metz et al. | 361/56 |
| 5,986,861 A | * | 11/1999 | Pontarollo | 361/56 |
| 5,994,943 A | * | 11/1999 | Suh et al. | 327/310 |

* cited by examiner

Primary Examiner—Jeffrey Zweizig
(74) Attorney, Agent, or Firm—Lisa K. Jorgenson; Jose Gutman; Fleit, Kain, Gibbons, Gutman & Bongini P.L.

(57) ABSTRACT

A protection device includes a switching transistor (M11), connected between the gate of the output transistor (TS1) and ground, and a control circuit (CM), connected to the gate of the switching transistor (M11), which are capable of ensuring that the switching transistor (M11) is off when there is no electrostatic discharge at the drain of the output transistor (TS1) and capable of turning the switching transistor (M11) on when there is an electrostatic discharge at the drain of the output transistor (TS1).

20 Claims, 1 Drawing Sheet

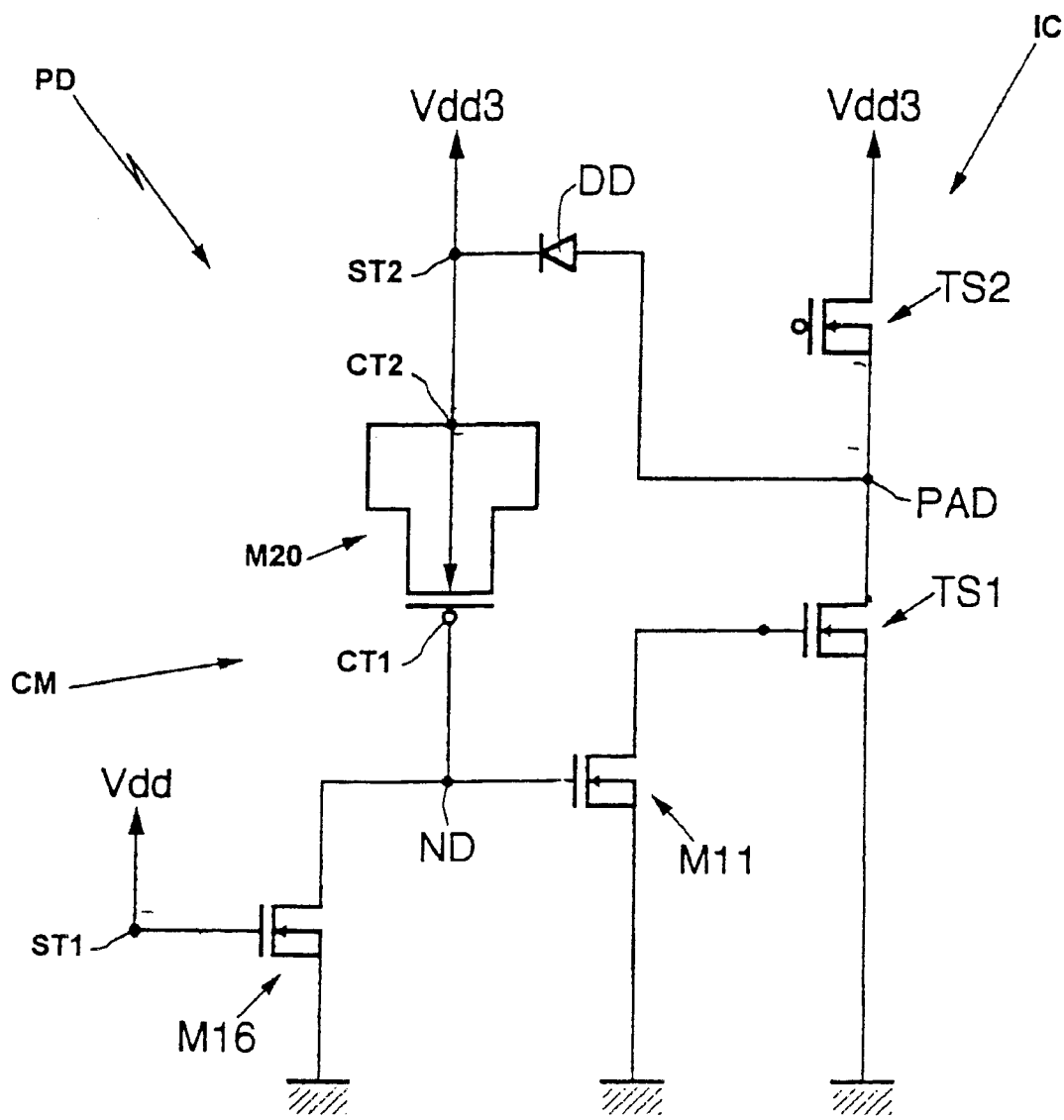

ELECTROSTATIC DISCHARGE PROTECTION DEVICE FOR AN INTEGRATED TRANSISTOR

CROSS-REFERENCE TO RELATED APPLICATIONS

This application is based upon and claims priority from prior French Patent Application No. 0010814, filed on Aug. 22, 2000, the entire disclosure of which is herein incorporated by reference.

BACKGROUND OF THE INVENTION

1. Field of the Invention

The invention relates to electrostatic discharge protection of integrated circuits, and more particularly the protection of an nMOS transistor incorporated in an output cell of an integrated circuit.

2. Description of the Prior Art

At the present time, electrostatic discharge protection of an integrated circuit is provided by placing, for example, specific protection devices in the supply cells or else locally in parallel with the output cell of the integrated circuit.

Such protection devices protect the integrated circuits by providing a low-resistance path during an electrostatic discharge.

However, such protection devices have certain drawbacks. One of them relates to the robustness of the protection device itself. Another drawback relates to the triggering of undesirable conduction within a particularly sensitive component of the integrated circuit, for example an nMOS output transistor placed in parallel with the protection device.

The reason for this is that, in advanced CMOS technologies, nMOS transistors are sensitive and a low overvoltage at their terminals can be sufficient to initiate conduction within the parasitic bipolar transistor formed between the source and the drain of the nMOS transistor. This undesirable current flow between the source and the drain of the nMOS transistor may accelerate the appearance of defects in the nMOS transistor.

Accordingly, there exists a need for overcoming the disadvantages of the prior art as discussed above.

SUMMARY OF THE INVENTION

The invention aims to remedy these drawbacks as discussed above.

It is an object of the invention to provide an electrostatic discharge protection device that prevents any undesirable MOS conduction through the output transistor during an electrostatic discharge and which consequently delays the triggering of the parasitic bipolar transistor and the appearance of defects.

A preferred embodiment of the present invention therefore provides an electrostatic discharge protection device for an integrated transistor called an "output" transistor. According to a general aspect of the invention, this device comprises a switching transistor, connected between the gate of the output transistor and ground, and control means connected to the gate of the switching transistor. The control means is capable of ensuring that the switching transistor is off when there is no electrostatic discharge at the drain of the output transistor and capable of turning the switching transistor on when there is an electrostatic discharge at the drain of the output transistor.

In other words, when an electrostatic discharge occurs at a package pin connected to the drain of the output transistor, the device according to the invention ensures that the potential of the output transistor gate is pulled down to ground. Thus, any undesirable conduction within the transistor is avoided. In contrast, during normal operation of the integrated circuit, the protection device is transparent with respect to the integrated circuit. In other words, the device has no influence on the gate of the output transistor.

According to one embodiment of the device according to the invention, the control means comprises:

- a capacitor (for example formed by a pMOS transistor whose drain and source are connected together), a first terminal of which is connected to the gate of the switching transistor and the second terminal of which is electrically coupled to the drain of the output transistor (that is to say to the contact that it is desired to protect) during the electrostatic discharge;
- a first supply terminal electrically dissociated from the drain of the transistor during the electrostatic discharge; and
- a first transistor (for example, an nMOS transistor), the gate of which is connected to the first supply terminal, the source of which is connected to ground and the drain of which is connected to the gate of the switching transistor.

Thus, during normal operation of the integrated circuit, the first transistor is on, thereby putting the gate of the switching transistor at ground potential. The latter is consequently off. The protection device therefore has no influence on the gate of the output transistor.

When the integrated circuit is not in operation, that is to say not supplied, it is consequently not biased and capacitively coupled to ground. Consequently, the first supply terminal is not biased and has a low potential. During an electrostatic discharge at the drain of the output transistor, the potential at this drain rises. The potential at the second terminal of the capacitor, which is electrically connected to the drain of the output transistor during this electrostatic discharge, also rises.

Since the first supply terminal is electrically dissociated from the drain of the transistor during the electrostatic discharge, the potential at this supply terminal does not rise, thereby allowing the first terminal to remain in the off state. This can therefore be likened to a capacitor (formed between the drain and the source of this transistor). Because of the capacitive bridge formed by the capacitor, the first transistor in its off state, and the switching transistor, a rise in voltage occurs on the gate of the switching transistor, thereby turning it on and consequently connecting the gate of the output transistor to ground and consequently turning the latter off.

Of course, a person of ordinary skill in the art will know how to adjust the ratio of the capacitance of the capacitor to the sum of the capacitances of the first transistor and of the switching transistor so as to obtain, during an electrostatic discharge, a voltage at the gate of the switching transistor such that the gate-source voltage of this switching transistor is greater than the threshold voltage of this switching transistor.

However, it will be advantageous to choose a capacitive ratio such that the capacitance of the capacitor formed, for example, by the pMOS transistor is greater than the sum of the capacitances of the first transistor and of the switching transistor, so as to further increase the effectiveness of the turning on of the switching transistor during an electrostatic discharge.

According to a preferred embodiment of the invention, the control means comprises a second supply terminal dissociated from the first supply terminal and connected to the drain of the output transistor. The second terminal of the capacitor is therefore connected to the second supply terminal.

It is also possible according to another embodiment to replace the first transistor with a resistive element and/or to use a single supply.

BRIEF DESCRIPTION OF THE DRAWING

Further advantages and features of the invention will become apparent on examining the description of an entirely non-limiting embodiment and the appended drawing in which the single FIGURE very schematically illustrates one embodiment of a protection device according to the invention.

DESCRIPTION OF THE PREFERRED EMBODIMENTS

In FIG. 1, the reference IC denotes an integrated circuit, the output cell of which comprises, here, an nMOS transistor TS1 and a pMOS transistor TS2, the substrate and the source of which are connected together to a supply Vdd3.

The drains of the two transistors are connected together and it is this node PAD that it is desired to protect against an electrostatic discharge by preventing the transistor TS1 from tripping resulting from a flow of current between its drain and its source.

To achieve this objective, the invention proposes to connect a protection device PD to the gate of the output transistor TS1 to be protected.

This protection device comprises a switching transistor M11, which is for example an nMOS transistor, connected between the gate of the output transistor TS1 and ground.

The protection device PD also includes control means CM, connected to the gate of the switching transistor M11, which means, as will be seen in greater detail below, ensure that the switching transistor is off when there is no electrostatic discharge at the drain of the output transistor, so as not to disturb the operation of the integrated circuit IC, and which turns the switching transistor M11 on when there is an electrostatic discharge at the drain of the output transistor, that is to say at the node PAD.

The control means CM includes a capacitor M20 formed here by a pMOS transistor whose drain and source are connected together. A first terminal CT1 of this capacitor, formed here by the gate of the pMOS transistor M20, is connected to the gate of the switching transistor M11. The second terminal CT2 of the capacitor, formed by the drain and the source of the pMOS transistor, is connected to a supply terminal ST2 intended to deliver the supply voltage Vdd3.

The control means CM also includes a transistor M16, which is denoted here as "first transistor" in order to distinguish it from the switching transistor. The gate of this first transistor is connected to a supply terminal ST1 intended to be supplied with a voltage Vdd. The two supplies, delivering the voltages Vdd and Vdd3 respectively are independent and electrically dissociated completely. As a result, the supply terminal ST1 is electrically dissociated from the drain of the transistor TS1, that is to say from the node PAD, during an electrostatic discharge.

The source of the first transistor M16 is connected to ground, while its drain is connected to the gate of the switching transistor M11.

During normal operation of the integrated circuit IC, and when there is no electrostatic discharge, the transistor M16 is on due to the voltage Vdd being applied to its gate. Consequently, the node ND is regarded as being at ground potential, thereby ensuring that the transistor M11 is off. Consequently, the protection circuit PD has no influence on the transistor TS1.

When the integrated circuit is not in operation, that is to say not supplied, the supply lines Vdd and Vdd3 are capacitively coupled to ground.

Consequently, the transistor M16 sees a low potential on its gate, ensuring that the transistor is off. It can then be regarded as a capacitor connected between the node ND and ground.

During an electrostatic discharge at the node PAD, the potential at this node rises, which also causes the potential at the terminal ST2 to rise because of the electrical link between the node PAD and the terminal ST2.

The capacitor M20 and the transistors M11 and M16 therefore form a capacitive bridge causing the appearance of a high potential at the node ND. This has the effect of turning the transistor M11 on and consequently turning the transistor TS1 off, thus preventing any undesirable conduction between its drain and its source.

A person of ordinary skill in the art will know how to choose the capacitive ratio of the capacitance of the capacitor M20 to the sum of the capacitances of the transistor M16 and of the transistor M11 so as to obtain a voltage at the node ND at least equal to the threshold voltage of the transistor M11 so as to turn the latter on when an electrostatic discharge occurs. Nevertheless, it would be preferable to choose a capacitive ratio of greater than 1. By way of indication, a pMOS transistor whose channel width and length are approximately equal, and about 2.5 $\mu$m, may be chosen. This results in a capacitance of $29\times10^{-15}$ F. As regards the transistor M16 this will, for example, be an nMOS transistor whose channel width is around 0.8 $\mu$m and whose channel length is around 0.3 $\mu$m, resulting in a capacitance of around $0.7\times10^{-15}$ F.

The transistor M11 may, for example, be a transistor having a channel width of around 10 $\mu$m and a channel length of around 0.3 $\mu$m, resulting in a capacitance of around $15\times10^{-15}$ F.

In this embodiment, most of the capacitance of the two transistors is provided by the transistor M11. Of course, it would be possible to envisage other embodiments in which most of the capacitance is provided by the transistor M16.

The use of two dissociated supplies Vdd and Vdd3 is particularly advantageous compared with the use of a single supply Vdd, since it makes the device according to the invention less sensitive to noise, which can occur on the supply and can modify the value of the voltage at the node ND.

Having said this, the device according to the invention would also operate with a single common supply Vdd, since, during normal operation of the integrated circuit and when there is no electrostatic discharge, the transistor M16 would be on, as indicated above. When an electrostatic discharge occurs, there would be a sudden rise in the voltage on the gate of the transistor M16, which would cause it to behave like a resistor. However, this sudden rise in the voltage, which would also occur at the terminal ST2, would also propagate to the node ND through the capacitor M20, turning the switching transistor M11 on.

It should also be noted that the transistor M16 could be replaced by a resistive element.

Moreover, the presence of the diode DD between the supply terminal ST2 and the node PAD allows the potential at the terminal ST2 to rise when there is an electrostatic discharge at the node PAD, but it does not disturb the normal operation of the integrated circuit when the latter is supplied.

Of course, a person of ordinary skill in the art can replace the diode DD with any component allowing current to flow in the direction from the node PAD to the terminal ST2 in order to allow the potential at the terminal ST2 to rise during the electrostatic discharge, but preventing the flow of a reverse current which would risk disturbing the normal operation of the integrated circuit when the latter is supplied.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An electrostatic discharge protection device for delaying, during electrostatic discharges, the triggering of a parasitic bipolar transistor formed between the source and the drain of an integrated output transistor, the electrostatic discharge protection device comprising:
    a switching transistor, connected between the gate of said integrated output transistor and ground; and
    control means, connected to the gate of the switching transistor, for
        ensuring that the switching transistor is off when there is no electrostatic discharge at the drain of the output transistor, and
        turning the switching transistor on when there is an electrostatic discharge at the drain of the output translator.

2. The electrostatic discharge protection device according to claim 1, wherein the control means comprises:
    a capacitor, a first terminal thereof being connected to the gate of the switching transistor and a second terminal of the capacitor being electrically connected to the drain of the output transistor when there is an electrostatic discharge;
    a first supply terminal;
    a first transistor,
        the gate thereof being connected to the first supply terminal,
        the source thereof being connected to ground, and
        the drain thereof being connected to the gate of the switching transistor.

3. The electrostatic discharge protection device according to claim 2, wherein the capacitance of the capacitor is greater than the sum of the capacitive value of the drain-source capacitance of the first transistor and of the capacitance of the switching transistor.

4. The electrostatic discharge protection device according to claim 2, wherein the capacitor is formed from a pMOS transistor whose drain and source are connected together.

5. The electrostatic discharge protection device according to claim 2, wherein the first supply terminal is electrically dissociated from the drain of the transistor during the electrostatic discharge, in that the control means includes a second supply terminal, dissociated from the first supply terminal and connected to the drain of the output transistor, and in that the second terminal of the capacitor is connected to the second supply.

6. The electrostatic discharge protection device according to claim 5, wherein the capacitor is formed from a pMOS transistor whose drain and source are connected together.

7. The electrostatic discharge protection device according to claim 5, wherein the capacitance of the capacitor is greater than the sum of the capacitive value of the drain-source capacitance of the first transistor and of the capacitance of the switching transistor.

8. The electrostatic discharge protection device according to claim 7, wherein the capacitor is formed from a pMOS transistor whose drain and source are connected together.

9. The electrostatic discharge protection device according to claim 1, wherein the control means includes:
    a capacitor,
        a first terminal that is connected to the gate of the switching transistor, and
        a second terminal that is electrically connected to the drain of the output transistor during the electrostatic discharge; and
    a resistor connected between the gate of the switching transistor and ground.

10. The electrostatic discharge protection device according to claim 9, wherein the capacitor is formed from a pMOS transistor whose drain and source are connected together.

11. An integrated circuit comprising:
    at least one output transistor; and
    at least one electrostatic discharge protection device for delaying, during electrostatic discharges, the triggering of a parasitic bipolar transistor formed between the source and the drain of the at least one output transistor, the at least one electrostatic discharge protection device being electrically connected between the gate of the at least one output transistor end ground, the at least one electrostatic discharge protection device comprising:
        a switching transistor, connected between a gate of the at least one output transistor and ground; and
        control means, connected to the gate of the switching transistor, for
            ensuring that the switching transistor is off when there is no electrostatic discharge at a drain of the at least one output transistor and
        turning the switching transistor on when there is an electrostatic discharge at the drain of the at least one output transistor.

12. The integrated circuit of claim 11, wherein the control means comprises:
    a capacitor, a first terminal thereof being connected to the gate of the switching transistor and a second terminal of the capacitor being electrically connected to a drain of the at least one output transistor when there is an electrostatic discharge;
    a first supply terminal;
    a first transistor,
        the gate thereof being connected to the first supply terminal,
        the source thereof being connected to ground, and
        the drain thereof being connected to the gate of the switching transistor.

13. The integrated circuit of claim 12, wherein the capacitance of the capacitor is greater than the sum of the capacitive value of the drain-source capacitance of the first transistor and of the capacitance of the switching transistor.

14. The integrated circuit of claim 12, wherein the capacitor is formed from a pMOS transistor whose drain and source are connected together.

15. The integrated circuit of claim 12, wherein the first supply terminal is electrically dissociated from the drain of the transistor during the electrostatic discharge, in that the control means includes a second supply terminal, dissociated from the first supply terminal and connected to the drain of the output transistor, and in that the second terminal of the capacitor is connected to the second supply.

16. The integrated circuit of claim 15, wherein the capacitor is formed from a pMOS transistor whose drain and source are connected together.

17. The integrated circuit of claim 15, wherein the capacitance of the capacitor is greater than the sum of the capacitive value of the drain-source capacitance of the first transistor and of the capacitance of the switching transistor.

18. The integrated circuit of claim 17, wherein the capacitor is formed from a pMOS transistor whose drain and source are connected together.

19. The integrated circuit of claim 11, wherein the control means includes:
   a capacitor,
      a first terminal that is connected to the gate of the switching transistor, and
      a second terminal that is electrically connected to a drain of the at least one output transistor during the electrostatic discharge; and
   a resistor connected between the gate of the switching transistor and ground.

20. The integrated circuit of claim 19, wherein the capacitor is formed from a pMOS transistor whose drain and source are connected together.

* * * * *